United States Patent
Garant et al.

(10) Patent No.: US 9,613,842 B2
(45) Date of Patent: Apr. 4, 2017

(54) WAFER HANDLER AND METHODS OF MANUFACTURE

(71) Applicant: INTERNATIONAL BUSINESS MACHINES CORPORATION, Armonk, NY (US)

(72) Inventors: John J. Garant, Poughkeepsie, NY (US); Jonathan H. Griffith, Poughkeepsie, NY (US); Brittany L. Hedrick, Wappingers Falls, NY (US); Edmund J. Sprogis, Underhill, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 535 days.

(21) Appl. No.: 14/183,989

(22) Filed: Feb. 19, 2014

(65) Prior Publication Data

US 2015/0235891 A1  Aug. 20, 2015

(51) Int. Cl.
| | |
|---|---|
| *H01L 21/00* | (2006.01) |
| *B32B 37/00* | (2006.01) |
| *B32B 38/00* | (2006.01) |
| *H01L 21/683* | (2006.01) |
| *B32B 37/24* | (2006.01) |
| *B32B 38/10* | (2006.01) |

(52) U.S. Cl.
CPC .......... *H01L 21/6835* (2013.01); *B32B 37/24* (2013.01); *B32B 38/10* (2013.01); *B32B 2037/246* (2013.01); *B32B 2315/08* (2013.01); *B32B 2457/14* (2013.01); *H01L 2221/68327* (2013.01)

(58) Field of Classification Search
CPC ......... H01L 21/00; H01L 21/60; H01L 21/68; H01L 21/683; H01L 21/6835; B32B 37/00; B32B 37/20; B32B 37/24; B32B 38/00; B32B 38/10
See application file for complete search history.

(56) References Cited

U.S. PATENT DOCUMENTS

| | | | |
|---|---|---|---|
| 8,283,237 B2 | 10/2012 | Rajagopalan et al. | |
| 8,299,615 B2 * | 10/2012 | Fayaz | H01L 21/76801 257/758 |
| 2004/0132227 A1 * | 7/2004 | Horning | B81C 1/00666 438/50 |
| 2010/0178766 A1 * | 7/2010 | Andry | H01L 21/76898 438/692 |
| 2012/0164829 A1 * | 6/2012 | Rajagopalan | H01L 21/02074 438/675 |

FOREIGN PATENT DOCUMENTS

EP  0866494 A1  9/1998

* cited by examiner

*Primary Examiner* — Michael N Orlando
*Assistant Examiner* — Matthew Hoover
(74) *Attorney, Agent, or Firm* — Yuanmin Cai; Andrew M. Calderon; Roberts Mlotkowski Safran Cole & Calderon, P.C.

(57) ABSTRACT

A wafer handler with a removable bow compensating layer and methods of manufacture is disclosed. The method includes forming at least one layer of stressed material on a front side of a wafer handler. The method further includes forming another stressed material on a backside of the wafer handler which counter balances the at least one layer of stressed material on the front side of the wafer handler, thereby decreasing an overall bow of the wafer handler.

14 Claims, 3 Drawing Sheets

WAFER HANDLER AND METHODS OF MANUFACTURE

FIELD OF THE INVENTION

The invention relates to wafer handlers and, more particularly, to a wafer handler with a removable bow compensating layer and methods of manufacture.

BACKGROUND

Semiconductor manufacturing consists of a complex set of processes. These processes include several building blocks, e.g.: (i) deposition of thin and thick films of material on a substrate, (ii) applying a patterned mask on top of the films by photolithographic imaging, and (iii) etching the films selectively to the mask. Each additive layer contributes to the wafer bow along with thermal processing. Also, even subtractive etch processes contributes to the wafer bow.

In the manufacturing of semiconductor devices, a wafer (e.g., silicon, device, or product) is placed on a wafer handler such as glass, bare silicon, etc. for processing of the product wafer. These processes include, for example, wafer thinning, as well as formation of structures on the wafer, e.g., deposition and patterning of films to form wiring, transistors, vias, metal pads, solder bumps, chip to chip interconnects, etc.

Prior to thinning, a product wafer has its own structural integrity and has a bow within the range of +/−300 microns which can be handled by most tools. Thinning the wafer eliminates this structural integrity and mandates the use of a handler wafer (e.g., glass, bare silicon). The handler bow and the thinned wafer bow together will combine to give the overall bow of the bonded pair. After thinning of the wafer to expose through silicon vias, for example, this bow can be well in excess of +/−300 microns. This bow can be even larger when using Si wafers from more advanced technology nodes.

It has been found through standard semiconductor manufacturing processes, bonded and thinned wafers on a wafer carrier can exceed process tool wafer handler capabilities and bow limits. This, in turn, can result in wafer mishandling, tool errors, and excessive wafer breakage during wafer finishing process steps. By way of example, it has been found that thinning of the wafer results in fluctuations in wafer handler bow. Also, through wafer finishing, the deposition of patterned metal, dielectric, and polymer layers on the grind side of the wafer exert additional stress on the bonded thinned wafer causing further fluctuations in the bow of the bonded pair (and hence wafer). Further, during thermal processes the glass transition temperature of the bonding adhesive can be exceeded, softening the adhesive and resulting in movement of the thinned wafer and wafer handler apart from each other. Once the bonded pair cool and the adhesive returns to a rigid state, the thinned wafer and the wafer handler will have a new bow. This new bow, though, may be too excessive for wafer handling downstream.

Handling of the wafer handler itself in steps prior to joining with the product wafer can be an issue as the wafer handler can be engineered to have bow in excess of its inherent bow. Glass wafer handlers alone do not have the appropriate strength and rigidity to support a thinned wafer through semiconductor manufacturing processes.

SUMMARY

In an aspect of the invention, a method comprises forming at least one layer of stressed material on a front side of a wafer handler. The method further comprises forming another stressed material on a backside of the wafer handler which counter balances the at least one layer of stressed material on the front side of the wafer handler, thereby decreasing an overall bow of the wafer handler.

In another aspect of the invention, a method comprises forming a removable stress compensating layer on a backside of a wafer handler. The method further comprises forming a first stress compensating layer on a front side of the wafer handler. The method further comprises forming a second stress compensating layer on the first stress compensating layer. The method further comprises bonding a wafer to the second stress layer. The method further comprises removing the removable stress compensating layer from the backside of the wafer handler, and processing the wafer.

In yet another aspect of the invention, a structure comprises: a wafer handler having an inherent bow; a removable stress compensating layer on a backside surface of the wafer handler; a first stress layer on a front side surface of the wafer handler; and a second stress layer on the first stress layer. The removable stress compensating layer on the backside surface of the wafer handler compensates for a stress component placed on the wafer handler by the first stress layer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to wafer handlers and, more particularly, to a wafer handler with a removable bow compensating layer and methods of manufacture. In more specific embodiments, the present invention provides two layers of material (also referred to as films) on a front side of the wafer handler and a compensating layer of material on a backside of the wafer handler which, when removed, eliminates or compensates for any bow that may have otherwise resulted during wafer thinning and/or other downstream processes. The removal of the backside film enables bow correction, since it no longer balances out the first film deposited on the front side of the wafer. In embodiments, the compensating layer of material on the backside of the wafer handler allows (or is necessary) for an additional layer of material to be placed on the front side of the wafer handler, prior to bonding and thinning of the wafer, itself. This additional layer of material will reduce and, if equally stressed, can balance any excessive bowing of the wafer handler that may result from front side compensation.

By way of explanation, post bond wafer bow needs to be corrected for in advance by applying a stress compensating layer to the handler wafer prior to bonding. It became known when processing 3D wafers in 22 nm technology than an even greater handler compensation was required to maintain reasonable post bond wafer bow. However, applying greater stress compensation to the wafer handler in a single layer results in a wafer handler bow so large that it is no longer possible for the bond tool to pick up and process the wafer handler. The present invention compensates for such wafer handler bow by first applying one layer (also referred to as a film) of compensation to backside of the wafer handler, followed by one layer of material to the front side of the wafer handler, and then an additional layer on the front side of the wafer. In this way, the net compensation is equivalent to one layer on the top side only. In embodiments, the order of the deposition steps, e.g., deposition of one layer on the backside and then two layers on the front side, minimizes the need for additional wafer flipping.

At some point in the downstream processing, the backside material is removed. The removal of the backside material in combination with the two upper layers, though, will effectively increase the bow of the wafer handler allowing for greater contribution to the bow of the bonded thinned wafer, and additional support compared to conventional structures. This is compared to merely placing a single thicker or higher stress layer on the wafer handler, which would prevent bonding of the wafer due to the high stresses imposed by the single stress layer.

Figure 1:
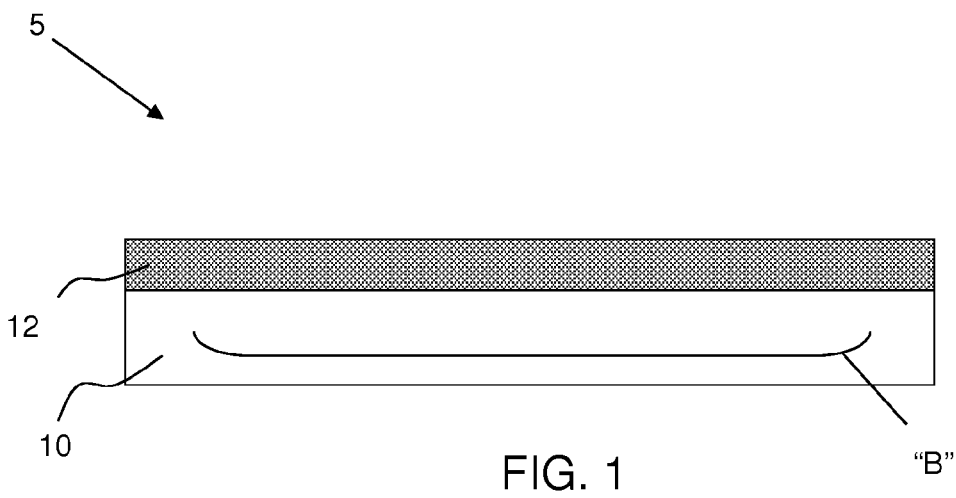
FIG. 1 shows a removable bow compensating layer formed on an underside of a wafer handler structure and fabrication processes in accordance with aspects of the present invention.

FIG. 1 shows a removable bow compensating layer formed on an underside of a wafer handler structure and fabrication processes in accordance with aspects of the present invention. More specifically, FIG. 1 shows a structure 5 comprising a removable bow compensating layer 12 deposited onto a backside of a wafer handler 10. In embodiments, the wafer handler 10 is glass and more preferably borosilicate glass, which has an inherent bow "B". It should be understood by those of ordinary skill in the art, though, that other wafer handlers are also contemplated by the present invention, e.g., silicon. In embodiments, the removable bow compensating layer 12 is oxide deposited to a thickness of about 2.25 microns using a conventional chemical vapor deposition (CVD) process; although other dimensions are also contemplated by the present invention and such noted thickness should not be considered a limiting feature of the present invention. The oxide is transparent to the release process of a wafer, e.g., 308 nm wavelength laser; that is, the oxide does not significantly absorb the 308 nm laser wavelength that enables removal of the glass handler 10 from the product wafer by means of adhesive ablation through the glass.

Figure 4:
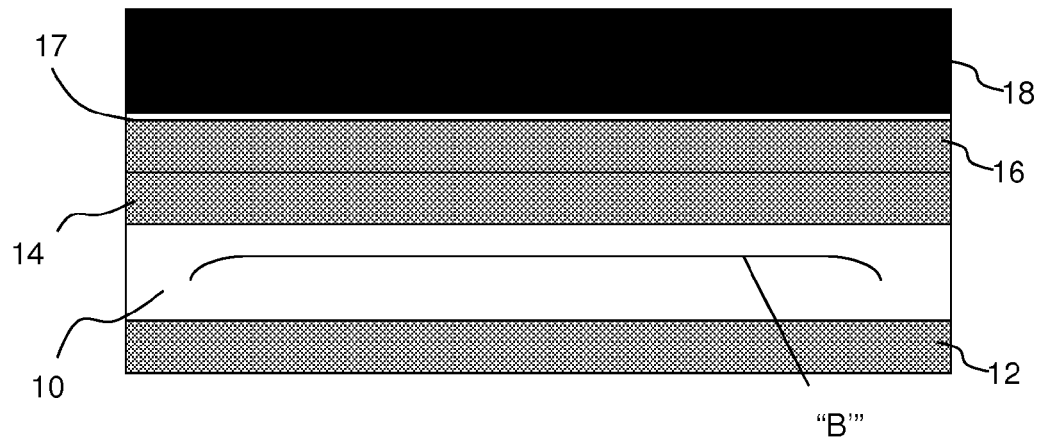
FIG. 4 shows a wafer placed on the wafer handler structure, and respective processing steps in accordance with aspects of the present invention.
Figure 5:
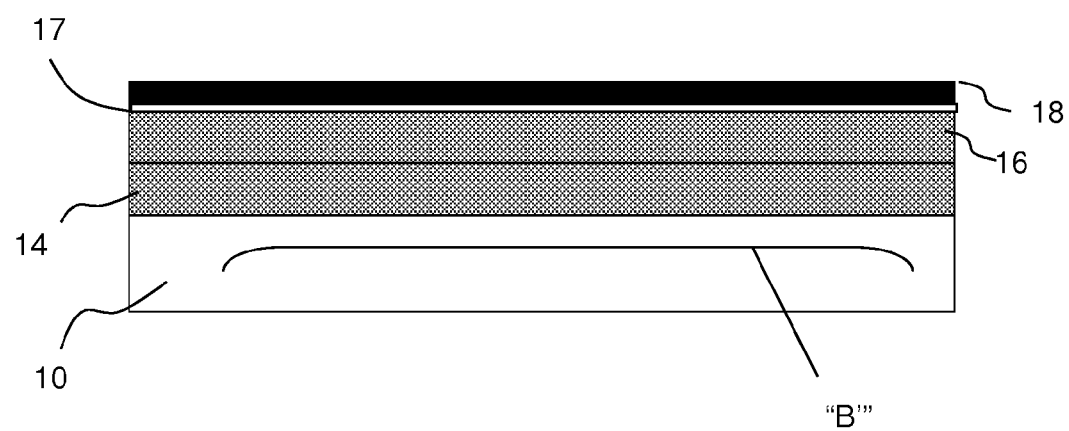
FIG. 5 shows a wafer handler structure with a thinned wafer and removal of the bow compensating layer and fabrication processes in accordance with aspects of the present invention.

In embodiments, the present invention also contemplates other materials and thicknesses for the removable bow compensating layer 12. For example, depending on the wafer handler material, a tensile or compressive material can be deposited on the wafer handler 10 in order to impose a stress thereon and hence compensate for any bowing of the bonded thinned product wafer/wafer handler pair downstream (e.g., see FIG. 4). By way of non-limiting example, the removable bow compensating layer 12 can be a compressive film such as Ti, TiW or other metal or CVD films, or a tensile film. Accordingly, it should be understood by those of skill in the art that the thickness and material of the removable bow compensating layer 12 can be tailored to adjust the stress on the wafer handler 10, e.g., to compensate for the inherent bow of the wafer handler 10 and of the bonded thinned product wafer/wafer handler pair through downstream processing as shown in FIGS. 4 and 5.

Figure 2:
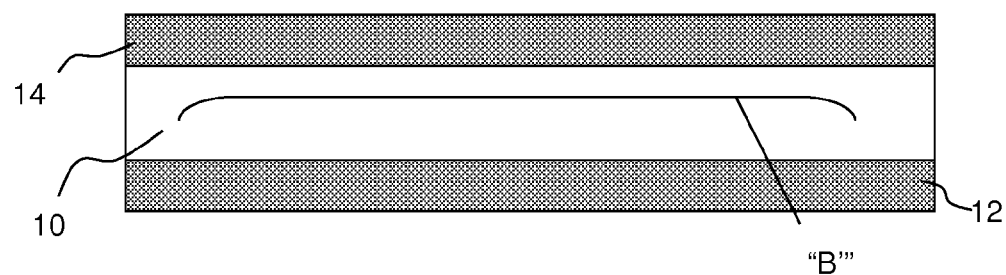
FIG. 2 shows a bow compensating layer formed on a front side of the wafer handler structure and fabrication processes in accordance with aspects of the present invention.

FIG. 2 shows a bow compensating layer 14 formed on the front side of the wafer handler 10. In embodiments, the bow compensating layer 14 is an oxide material, formed by CVD processes. In further embodiments, the bow compensating layer 14 should be the same material and thickness as the removable bow compensating layer 12 in order to provide an equal (or counter balance of) stress on both the front side and backside of the wafer handler 10. For example, in embodiments, the bow compensating layer 14 is oxide deposited to a thickness of about 2.25 microns using a conventional CVD processes; although other thicknesses of the bow compensating layer 14 are also contemplated by the present invention. Thus, it should be understood by those of skill in the art that the thickness of the bow compensating layer 14 can be modulated or tailored to adjust the stress on the wafer handler 10, e.g., to compensate for the inherent bow of the wafer handler 10 and of the bonded thinned product wafer/wafer handler pair through downstream processing (see, e.g., FIGS. 4 and 5).

Figure 3:
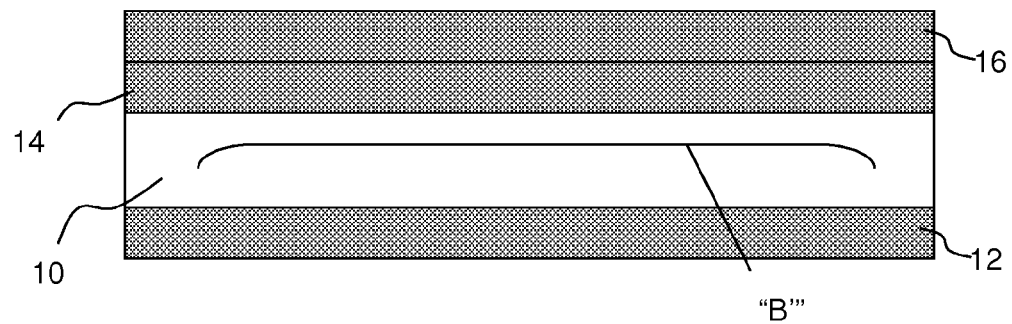
FIG. 3 shows an additional layer formed on the front side of the wafer handler structure and fabrication processes in accordance with aspects of the present invention.

FIG. 3 shows a second stress layer 16 formed on the front side of the wafer handler 10. In more specific embodiments, the second stress layer 16 is deposited on the bow compensating layer 14, using conventional CVD processes. The second stress layer 16 can be an oxide or other films as contemplated herein. In embodiments, the second stress layer 16 can have any desired thickness or stress component as would be needed to support the bonded thinned wafer to be processed with the wafer handler 10.

In embodiments, the films (e.g., layers 12, 14, 16) on the wafer handler 10 can be tailored through their thickness or stress as is needed to manage bow fluctuations that the bonded wafer and wafer handler 10 together will experience after bonding (primarily excursions after thinning). Also, as should be understood by those of ordinary skill in the art, the removable bow compensating layer 12 formed on the backside of the wafer handler 10 will compensate for the second stress layer 16, such that the wafer handler 10 is still suitable to be handled for additional processing steps and is not overly bowed.

It should also be understood by those of skill in the art that the removable bow compensating layer 12 is needed because two films on the front of the wafer handler (or a single sufficiently stressed or thick film) alone will bow the wafer wafer so excessively that it cannot be handled by a bonder, e.g., processing tool. In this way, the backside film (removable bow compensating layer 12) will act as a counter balance to one of the two front side layers 14, 16 through the bonding operation. As described herein, once through bond and attached to the product wafer, the removable bow compensating layer 12 on the backside of the wafer handler 10 can be removed, fully enabling both front side films (i.e., layers 14, 16).

FIG. 4 shows a wafer 18 bonded to the wafer handler 10. More specifically, the wafer 18 is bonded to the top surface of the wafer handler 10, terminated with the second stress layer 16, using any known bonding material 17. For example, the wafer 18 can be bonded to the top surface of the wafer handler 10, terminated with the second stress layer 16, by an oxide material, adhesive or other known method as depicted by reference numeral 17. For example, in embodiments, the wafer 18 can be bonded to the top surface of the wafer handler 10, terminated with the second stress layer 16, using any known adhesive 17 conventionally used for such bonding processes. The wafer 18 can be composed of any type of semiconductor material such as, for example, Si, SiGe, etc.

In FIG. 5, the bow compensating layer 12 is removed using a grinding or polishing process. In embodiments, this grinding or polishing process can be accomplished using a grinding disk with conventional slurry or a CMP polishing pad with conventional slurry. As the wafer 18 will later be thinned, this grinding or polishing process can be performed without concern of damage or contamination to the wafer 18, which will need to be in contact with the tool's chuck surface while the opposing wafer handler is having the removable film taken off. After the grinding or polishing process on the carrier, the product wafer 18 can be thinned using conventional thinning processes.

In alternate embodiments, the removable bow compensating layer 12 can be removed after the thinning processes or other downstream processing. In these embodiments, the wafer 18 or any exposed surfaces or structures formed on the wafer 18 should be protected, e.g., by using a grind tape, since the protected surface will be in contact with the tool chuck. The grind tape can be, for example, UV, heat and/or peel releasing adhesive tapes. The grind tape is removed after removal of the bow compensating layer 12 and the surface and/or structures is cleaned using an ashing process.

Figure 6:
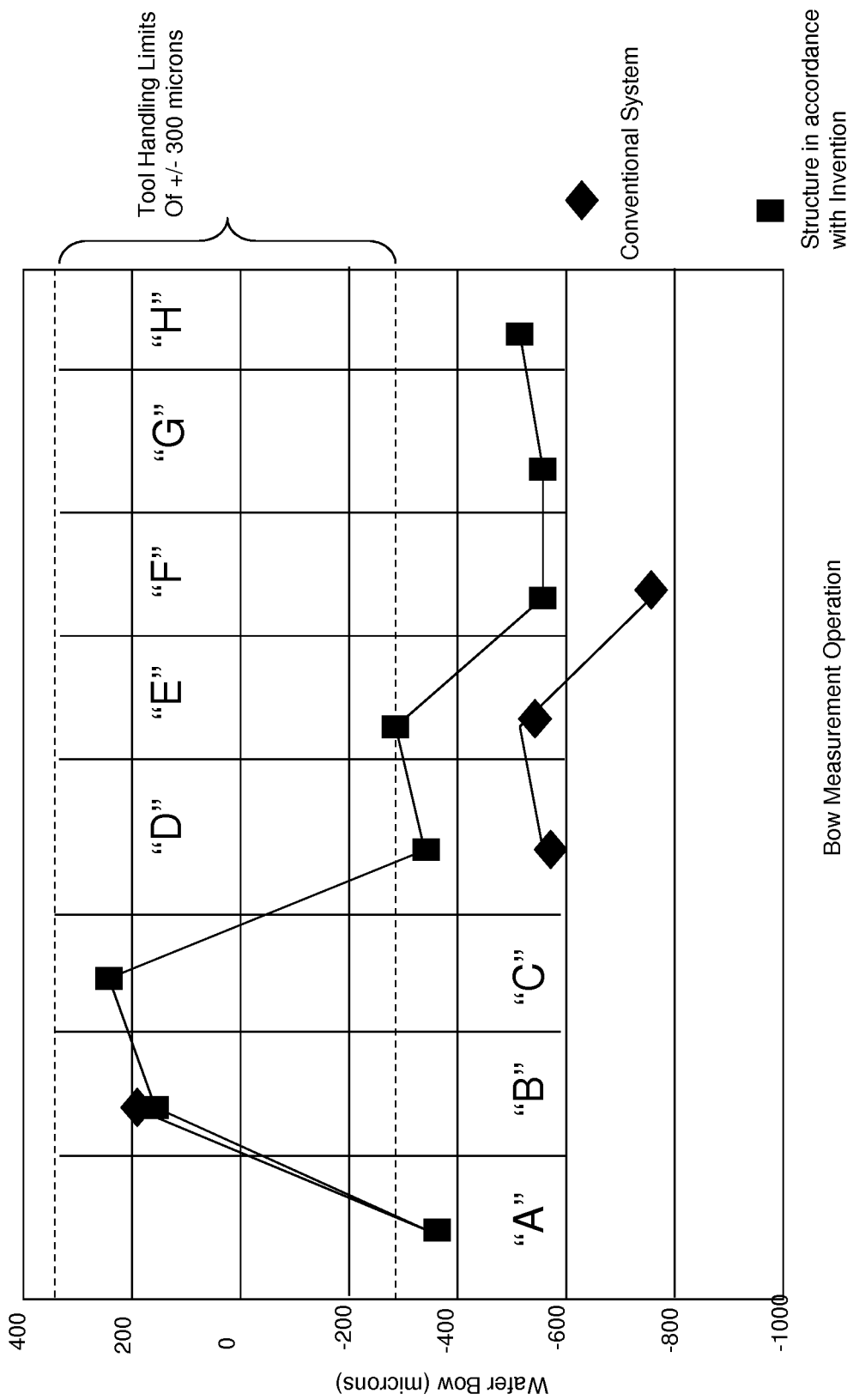
FIG. 6 shows a comparison graph of bowing of bonded thinned wafers on the wafer handler structures at different processing stages.

FIG. 6 shows a comparison graph of bonded process wafers on handler structures at different processing stages. The y-axis is representative of bow measurement (in microns) and the x-axis is representative of different processing stages. In this graph, a conventional wafer handler was compared to a wafer handler processed in accordance with the present invention during different processing stages "B"-"H". Stage "A" is the starting bow of the product wafers alone, before bonding occurs. In embodiments, the stages include:

(i) stage "A" is an incoming wafer, prior to processing;
(ii) stage "B" is post bonding of the wafer to the wafer handler;
(iii) stage "C" is removal of the removable bow compensating layer; and
(iv) stages "D"-"H" are post processing stages such as, for example, thinning of the wafer, oxide and nitride deposition, metal sputtering, nitrogen deposition, post polymer cure (e.g., high temperature polymer cure) and post sputter, as examples.

As shown from the graph of FIG. 6, both the incoming wafers at stage "A" have similar inherent bow. When bonded to wafer handlers at stage "B", the wafer handler processed according to the present invention has a slightly less bow than the wafer handler having a conventional single film handler. This bow, though, is not significantly different. This demonstrates that the removable backside film (i.e., the removable bow compensating layer 12) does counter balance one of the front side films 14, 16, leaving the additional front side film 16 to govern the handler bow. At stage "C", the removable bow compensating layer 12 is removed, which is shown by a slight increase in bonded product wafer/wafer handler bow compared to the preceding measurement of the same wafer with the bow compensating layer 12 intact.

However, at stage "D", the bonded thinned wafer on the wafer handler manufactured in accordance with the present invention has a significantly less bow than that of the thinned wafer bonded to the conventional wafer handler. This is due to the two layers of material, i.e., layers 14 and 16, on a front side of the wafer handler providing an increased stress component to compensate for the bowing experienced by the bonded pair due to the process films that have been added to the thinned product wafer. This positive shift (or correction) in bow of the bonded thinned product wafer on the wafer handler manufactured in accordance with the present invention can be upwards of approximately 200 microns. The bow of the bonded thinned product wafer on the wafer handler manufactured in accordance with the present invention (with films 14 and 16) will remain significantly more positive throughout remaining processes, as compared to that of the bonded thinned product wafer on the conventional wafer handler.

It should be understood that the present invention can be implemented with either a compressive film or a tensile film, depending on the behavior of the bonded pair, e.g., wafer handler 10 and wafer 18. For example, as shown in FIG. 6 at stages "D" to "H", a compressive film can be used to protect against an excessively negative bow. It should be understood that this compressive film could be tailored depending on the behavior of the bonded wafer to the wafer handler. Also, it should be understood that a tailored tensile film can be used to protect against an excessively positive bow.

The methods as described above are used in the fabrication of integrated circuit chips that are thinned and need to be processed on a wafer handler. The resulting thinned integrated circuit chips can be distributed by the fabricator in raw wafer form (that is, as a single wafer that has multiple unpackaged chips), as a bare die, or in a packaged form once they are removed from the wafer handler as described herein. In packaged form the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. The end product does not include the wafer handler described herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
  a wafer handler having an inherent bow;
  a removable stress compensating layer on a backside surface of the wafer handler;
  a first stress layer on a front side surface of the wafer handler; and
  a second stress layer on the first stress layer, wherein the removable stress compensating layer on the backside surface of the wafer handler compensates for a stress component placed on the wafer handler by the first stress layer.

2. The structure of claim 1, further comprising a wafer bonded to a top surface of the second stress layer.

3. The structure of claim 1, wherein at least the first stress layer provides support for the wafer handler and an attached wafer during downstream processing.

4. The structure of claim 1, wherein the removable stress compensating layer and the first stress layer are of a same material and thickness.

5. The structure of claim 1, wherein the first stress layer and the second stress layer are stressed material of a same material type.

6. The structure of claim 1, wherein the removable stress compensating layer is a tensile stress film.

7. The structure of claim 1, wherein the removable stress compensating layer is a compressive stress film.

8. The structure of claim 1, wherein the wafer handler is a glass wafer handler and the removable bow compensating layer is deposited on the glass wafer handler.

9. The structure of claim 1, wherein the removable stress compensating layer and the first stress layer impart a same stress to the wafer handler on opposite sides thereof.

10. The structure of claim 1, wherein the removable stress compensating layer and the first stress layer are oxide material which is transparent to a release process of a wafer.

11. The structure of claim 1, wherein the removable stress compensating layer is a compressive film of Ti.

12. The structure of claim 1, wherein the removable stress compensating layer is a compressive film of TiW.

13. The structure of claim 1, wherein the first stress layer is oxide material and has a same thickness as the removable stress compensating layer.

14. The structure of claim 1, wherein the second stress layer is oxide material which is bonded to a wafer.

* * * * *